United States Patent [19]

Hadderman et al.

[11] Patent Number: 5,712,825
[45] Date of Patent: Jan. 27, 1998

[54] MAINTAINING DATA INTEGRITY IN DRAM WHILE VARYING OPERATING VOLTAGES

[75] Inventors: Scott Jeffrey Hadderman, Pleasant Valley, N.Y.; David Elson Douse, Jericho; Kraig Richard White, Colchester, both of Vt.

[73] Assignee: International Business Machines Corporation, Armonk, N.Y.

[21] Appl. No.: 729,220

[22] Filed: Oct. 9, 1996

[51] Int. Cl.$^6$ ................................................. G11C 11/401
[52] U.S. Cl. ........................................... 365/222; 365/226
[58] Field of Search ............................... 365/222, 226, 365/228

[56] References Cited

U.S. PATENT DOCUMENTS

| | | | |
|---|---|---|---|
| 4,901,283 | 2/1990 | Manbury et al. | 365/222 |
| 4,943,960 | 7/1990 | Komatsu et al. | 365/222 |
| 5,278,797 | 1/1994 | Jeon et al. | 365/222 |
| 5,365,487 | 11/1994 | Patel et al. | 365/226 |
| 5,379,400 | 1/1995 | Barakat et al. | 365/222 |
| 5,418,747 | 5/1995 | Tobita | 365/194 |
| 5,566,121 | 10/1996 | Hadderman et al. | 365/222 |
| 5,610,869 | 3/1997 | Yoo et al. | 365/222 |

*Primary Examiner*—Tan T. Nguyen
*Attorney, Agent, or Firm*—Marc A. Ehrlich

[57] ABSTRACT

A method and apparatus for operating a DRAM while varying the supply voltage provided thereto. A memory system is designed to attach to a DRAM. The DRAM is capable of maintaining data stored therein until supply voltage is varied beyond a predetermined voltage change level without the performance of a refresh operation. The system includes a power source coupled to the DRAM for providing supply voltage thereto and a refresh signal generation device coupled to the DRAM for causing the DRAM to perform refresh operations wherein the charges associated with data bits stored within the DRAM memory cells are refreshed thereby maintaining the data integrity of data stored in the DRAM. The relative rates of supply voltage change and refresh signal provision are adjusted so as to ensure that refresh signals are provided to the DRAM prior to a point in time at which the change in supply voltage provided to the DRAM exceeds the predetermined voltage change level. Accordingly, it is possible to achieve reliable operation of the DRAM while the supply voltage provided thereto is varied.

26 Claims, 6 Drawing Sheets

MAINTAINING DATA INTEGRITY IN DRAM WHILE VARYING OPERATING VOLTAGES

CROSS REFERENCE TO RELATED APPLICATIONS

This application for Letters Patent is related, and cross reference may be had to the U.S. patent application entitled "PCMCIA SRAM Card Function Using DRAM Technology" by Scott Hadderman et al., which has been assigned Ser. No. 521509 and was filed on Aug. 30, 1995 as well as the U.S. patent application entitled "A Method for PCMCIA Card Function Using DRAM Technology" by Scott Hadderman et al. which has been assigned Ser. No. "521508" and was filed on Aug. 30, 1995.

FIELD OF THE INVENTION

The present invention relates to the field of memory system design for systems in which the supply voltage levels provided to the memory may be varied during normal operation. In particular, the present invention relates to a method and associated apparatus permitting the use of dynamic random access memories (DRAM's) in systems which experience variations in supply voltage levels. The present invention enables the variation of the DRAM operating voltage without jeopardizing the integrity of the data stored therein.

BACKGROUND OF THE INVENTION

The recent proliferation of battery-powered portable electronic data processing equipment such as laptop computers, PDAs, etc. has precipitated a concomitant need for memory devices which offer high storage densities and low operational power requirements. Additionally, portable memory card subsystems have been fabricated which permit a user to removably attach additional memory to their computing system. An example of such a memory subsystem is described in U.S. patent application Ser. No. 521509, filed Aug. 30, 1995 for Hadderman et al. (assigned to the present assignee hereof) which describes a PCMCIA memory card including a DRAM device. Such removable memory subsystems must be capable of operation within a range of supply voltages while ensuring that the data stored in the memory device is not affected by variations in the voltage supplied to the device. For high storage capacity applications DRAM devices are preferred over static random access memory (SRAM) devices as they typically exhibit greater storage capacity. However, DRAM devices are typically not utilized in applications which experience operating voltage variations, due to concerns with data corruption or loss.

A DRAM requires a data retention mode of operation to ensure that data stored in the capacitors of each memory cell is not lost due to leakage of the capacitor or by leakage current from the substrate over time. During this data retention mode of operation, a refresh operation is performed wherein voltage is applied to each of the memory cell capacitors in the DRAM thereby enabling them to maintain their charge. Additionally, during normal operation modes a DRAM may receive external refresh instructions (i.e. ordered signals on the RAS and CAS lines of the DRAM) which will cause the DRAM to cycle through a refresh operation to maintain the integrity of the data stored therein.

A typical DRAM device includes a number of reference voltage cells. Each of the memory cells in a DRAM is associated with a reference voltage cell. A sense amplifier is further associated with each memory cell for providing access to the memory cell data. The sense amplifier amplifies the voltage difference between two bit lines connected to the memory cell as a bit line pair. Both lines in the bit line pair are initially charged to a reference voltage level $V_{ref}$ by the associated reference voltage cell. A memory cell capacitor containing a charge corresponding to the data stored in the particular memory cells is coupled to one of the lines in the bit line pair. The voltage difference between the memory cell capacitor and the coupled bit line results in either a voltage gain or a voltage drop on the coupled bit line. Accordingly, a voltage difference will develop between each line of the bit line pair. It is this voltage difference, amplified by the sense amplifier, that represents the data that is stored in the particular memory cell.

The reference voltage cell charge and the charge stored in the memory cell capacitor are both restored during the refresh operation. The voltage level to which each of these elements are restored is a function of the supply voltage provided to the DRAM during the refresh operation. In applications where the supply voltage provided to the DRAM varies beyond a certain voltage level before a refresh operation occurs, the reliability of the data stored in the memory cell is questionable.

For example, assume that for a particular DRAM, the supply voltage is initially at 5 volts and that during a refresh operation the reference voltage cell associated with a particular memory cell is charged to 2.5 volts. In an application where the supply voltage provided to a DRAM falls from 5 volts to 2.4 volts prior to a subsequent refresh operation, a write operation, in which it is intended to write a logical 1 into the particular memory cell may store 2.4 volts in the memory cell capacitor. At this point the $V_{ref}$ level is still 2.5 volts which is greater than the charge in the memory cell capacitor (2.4 volts) precipitating the storage of a logical 0 in that memory cell rather than the intended storage of a logical 1 therein.

It is apparent from the foregoing that in order to reliably operate a DRAM in a memory system which experiences significant variation in supply voltage, a mechanism must be provided to ensure that a refresh operation is performed for each of the reference voltage cells and each of the memory cell capacitors before the supply voltage variation can cause the loss of data integrity for the DRAM.

Presently, several designs exist which permit a DRAM to internally provide the required refresh operations. For example, U.S. Pat. No. 4,943,960 issued Jul. 24, 1990 to Komatsu et al. for "Self Refreshing Of Dynamic Random Access Memory Device And Operating Method Therefor" provides a DRAM which is capable of performing a selective refresh operation at one of two discrete rates in accordance with a one of two selective precharge voltage levels generated by precharge circuitry within the DRAM. Additionally, U.S. Pat. No. 5,365,487 issued Nov. 15, 1994 to Patel et al. for "DRAM Power Management With Self-Refresh", describes a DRAM configured to perform a self-initiated refresh operation in which on-chip power management circuits implement a special sleep-mode self refresh process that turns certain refresh circuits on and off thereby reducing DRAM power consumption during sleep mode. U.S. Pat. No. 5,278,797 issued Jan. 11, 1994 to Jeon et al. for "Semiconductor Memory Device Capable Of Executing Non-Periodic Refreshing Operations", describes a semiconductor memory device provided with an internal refresh request signal generator which provides non-periodic refresh operations within the device dependant upon the temperature of the device. Each of the above-referenced patents, describes on-chip modification to a memory device to achieve low power consumption. Such customized DRAMs typically comprise expensive and inflexible designs. Furthermore, none of these inventions address the problem of operating a DRAM while the supply voltage provided thereto is varied.

U.S. Pat. No. 5,418,747 issued on May 23, 1995 to Tobita for a "Dynamic Random Access Memory Having A Plurality Of Rated Operating Voltages As Operating Supply Voltage And Operating Method Thereof" describes a DRAM which includes on-chip circuitry capable of recognizing one of a plurality of discrete supply voltages received by the DRAM and generating a control signal for changing the activation timing and/or the operating speed of the DRAM's sense amplifier in conjunction with the supply voltage so as to operate the sense amplifier at the defined operation speed and timing. This selective speed/timing control of the sense amplifier permits the sensitivity of the sense amplifier to be raised by decreasing the charge/discharge speed thereof, and accordingly, the DRAM will function reliably at a lowered supply voltage. However, this patent requires on-chip modification to the DRAM and furthermore does not address the problem of operation of the DRAM as the supply voltage is varied, but rather addresses the fabrication of a DRAM which is operable at plural, discrete rated operation supply voltages.

Consequently, the problem of operating a DRAM while a supply voltage provided thereto is varied has not been addressed in the prior art.

SUMMARY OF THE INVENTION

The foregoing problems and the shortcomings of the prior art are overcome and additional advantages are provided by the present invention: a method and apparatus for maintaining the data integrity of data stored in a DRAM while varying the operating voltage provided thereto.

The present invention capitalizes on the property of DRAMs which permits a given DRAM to tolerate a certain level of supply voltage variance prior to the receipt of a refresh operation without loss of the data stored therein. The invention is premised on the principle that the adjustment of the relative rates of supply voltage change and refresh signal provision to the DRAM will ensure that a DRAM receives an instruction to cycle through a refresh operation prior to experiencing a change in supply voltage level which might result in the loss of DRAM data.

A memory system according to the present invention is designed for attaching to a DRAM. A DRAM for use with the invention is capable of performing a refresh operation to maintain the data stored therein. A threshold for this DRAM, may be determined, corresponding to the level of variance in supply voltage that may be tolerated thereby in the absence of a refresh operation without the risk of data loss. A power source is coupled to the DRAM for providing a variable level of supply voltage thereto, and a refresh signal generator is coupled to the DRAM for providing refresh signals to the DRAM to initiate the performance of the refresh operation.

In the present invention the rate of change of the supply voltage level provided through the power source to the DRAM and/or the rate of refresh signal provision to the DRAM may be variable. The relative rates of the power source and refresh generator are adjusted so as to ensure that the DRAM receives a refresh signal prior to a change in the supply voltage level that exceeds the determined threshold corresponding to the potential for data loss. The adjustment of the relative rates may, in particular embodiments, may entail altering the rate of the supply voltage change, altering the rate of the provision of refresh signals to the DRAM or adjusting both rates.

In a first implementation of the invention, the adjustment of the relative rates may be performed in a static manner, wherein, for example, in a first embodiment, a maximum rate of voltage change for the power source is ascertained and the refresh signal generator is implemented to provide refresh signals at a rate commensurate with the determined maximum voltage change rate. Likewise, in another embodiment, a minimum refresh signal provision rate may be ascertained and the power source may be set to vary the supply voltage at a rate commensurate with the ascertained minimum refresh rate. In each of these instances the relative rates of voltage change and refresh signal provision ensure that the DRAM performs a refresh operation prior to a supply voltage variation which may result in data loss.

In another embodiment of the invention which implements the aforementioned static adjustment of the relative rates, the DRAM may internally initiate the refresh operation at a set frequency. This internal refresh may occur in instances such as when the DRAM device is operating in a sleep (data-retention) mode. The static adjustment of the relative rates of the refresh signal and voltage change may be accomplished by inhibiting the function of the refresh generator and adjusting the power source to permit the supply voltage to vary at rate commensurate with the ascertained set internal refresh rate of the DRAM.

In a second implementation of the invention, the adjustment of the relative rates may be performed dynamically wherein the power source and refresh signal generator are coupled to each other to communicate rate information therebetween. In an illustrative embodiment, the power source may include sampling circuitry for sampling the refresh rate of the refresh signal generator and circuitry responsive to the sampled rate for adjusting the voltage change rate in accordance therewith. Likewise, in another embodiment, the refresh signal generator may include sampling circuitry for sampling the supply voltage change rate from the power source and circuitry for adjusting its refresh signal provision rate in accordance therewith. Moreover, the dynamic system implementation may further provide means for detecting that the DRAM has initiated a self-refresh operation at a fixed rate, as would be the case during a data-retention mode of operation, and respond by inhibiting the refresh signal generator and varying the rate of supply voltage change from the power source to coincide with the detected self-refresh operation rate.

BRIEF DESCRIPTION OF THE DRAWINGS

The subject matter which is regarded as the invention is particularly pointed out and distinctly claimed at the conclusion of the specification. The foregoing and other features and advantages of the invention will be apparent from the following detailed description in conjunction with the accompanying drawings, in which:

DETAILED DESCRIPTION OF THE PREFERRED EMBODIMENTS OF THE INVENTION

In accordance with the principles of the invention, a method and apparatus for maintaining the data integrity of data stored in a DRAM while varying its operating voltage is herein described.

Before referring in detail to our present invention, it may first be useful to discuss, by way of example, the operation of a typical DRAM device, and to illustrate the problems inherent in operating a DRAM in an application wherein the supply voltage provided thereto may be varied. Once we have provided this background, we will describe preferred embodiments of our present invention, which advantageously enables the use of a DRAM in such an application environment.

A conventional DRAM memory device is typically comprised of an array of memory cells, each of which may be independently accessed for reading and writing data thereto. Address signals are provided to the DRAM for accessing a particular memory cell involved in a read or write operation. The DRAM further includes row and column decoders for decoding the address signal to provide access to the desired memory cell. Each memory cell is coupled to a sense amplifier for reading and amplifying the data stored in the memory cell. I/O buffers are provided for storing the data to be received by or supplied from the DRAM.

Figure 1:
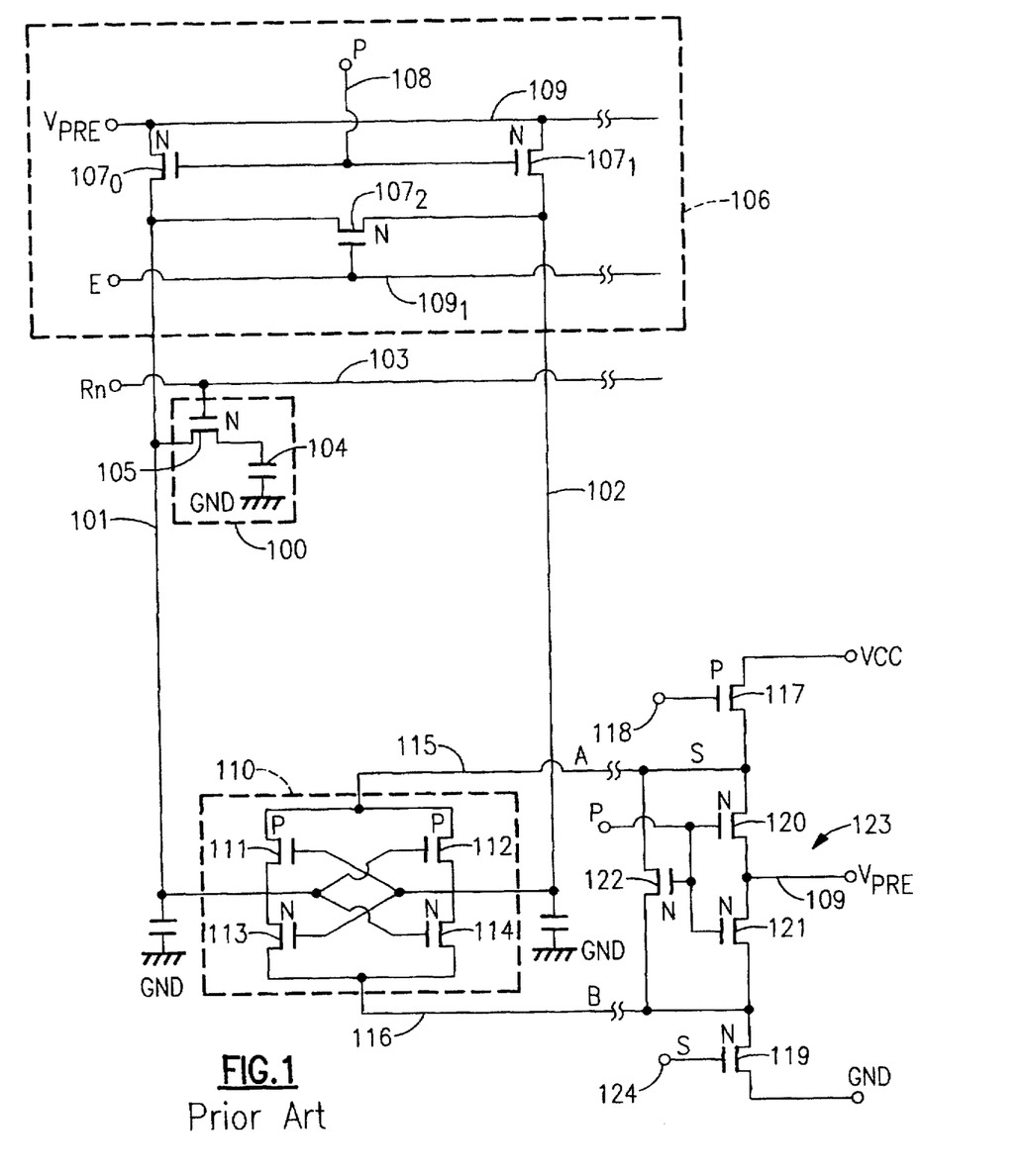
FIG. 1 depicts a circuit-level configuration for a typical DRAM memory cell and associated circuitry.

FIG. 1 depicts a circuit-level configuration for a typical DRAM memory cell. The memory cell 100 is shown connected between a bit line 101 and a word line 103. The memory cell 100 includes a memory cell capacitor 104 which is coupled to the first bit line 101 through select transistor 105. Select transistor 105, an n-channel transistor is turned on responsive to a word line driving signal on word line 103 coupling it to the memory cell capacitor.

A precharge equalizing circuit 106 includes n-FETs ($107_0$–$107_2$). N-channel FET $107_0$ is turned on via a precharge signal P applied to line 108 to transmit a precharge voltage $V_{pre}$ to the first bit line 101. The n-channel FET $107_1$ is turned on in response to an precharge signal P on line 108 to transmit the precharge voltage $V_{pre}$ to the second bit line 102 the n-channel FET $107_2$ is turned on by the equalization signal E on line $109_1$ and shorts the first 101 and second 102 bit lines. Accordingly, the equalization signal equalizes the charge on the first and second bit lines.

A sense amplifier 110 includes a CMOS flip flop connecting the first and second bit lines (101 and 102). The flip flop includes a pair of p-channel FETs (111 and 112) having their gates and a first of their electrodes cross-coupled and a pair of n-channel FETs (113 and 114) having their gates and a first of their electrodes cross-coupled. The first p-FET 111 and the first n-FET 113 are connected to the first bit line 101 via a first of their electrodes and the first of the electrodes of the second p-FET 112 and second n-FET 114 are connected to the second bit line 102. The other electrodes of the p-FETs are connected to the line 115 upon which a first sense amplifier activating signal is driven and the other electrodes of the n-FETS are coupled to line 116 for driving a second sense amplifier activating signal. The CMOS flip flop is connected between supply voltage $V_{cc}$ and ground via p-FET 117 which receives a first sense amplifier activating signal 118 and n-FET 119 which receives a second sense amplifier activating signal 124.

The I/O gate 123 comprises a series of n-FETs (120–122) which precharge and equalize the potentials on lines 115 and 116 to a predetermined potential $V_{pre}$ n-FET 120 is turned on in response to the signal transmitted via line 109 and in turn transmits $V_{pre}$ to line 115. The n-Fet 121 is likewise turned on responsive to the signal on line 109 to transmit $V_{pre}$ to line 115. The n-FET 122 is turned on is also turned on in response to the precharge signal on line 109 to short the potential between lines 115 and 116 so as to equalize the potential on these lines.

In operation, an equalization signal is applied to line $109_1$ and a precharge signal is applied to line 109. Via operation of the precharge equalization circuit, the bit lines 101 and 102 are brought to equal potentials typically $V_{cc}/2$. After a notRAS signal falls to its low level, the word line signal on word line 103 rises to a high level to turn on the select transistor 105 in the memory cell 101. In response to the select transistor 105 turning on, the memory cell capacitor 104 which is at a potential other than $V_{cc}/2$ either charges, drawing voltage from the first bit line 101 or discharges, slightly raising the potential of the first bit line 101, depending upon the current state of charge in the memory cell capacitor 104. In either case, there is created a slight potential difference between the first and second bit lines 101 and 102.

Typically, at this point the sense amplifier activation signals 118 and 120 drive the sense amplifier 110 into operation. The sense amplifier 110 amplifies the small potential difference between the first 101 and second 102 bit lines and the amplified signal is transferred through operation of the I/O circuit to the I/O for the memory cell.

The refresh operation is similar to the above-described read operation, with the exception that the amplified data signal is not applied to the I/O line. Instead it is applied back to the memory cell capacitor 104.

From the foregoing description, it will be apparent to one of skill in the art that a change in the supply voltage, which in turn alters the charge on the first and second bit lines 101 and 102 may offset the difference in potential between the first bit line 101 and the memory cell capacitor 104. Thus, if the potential on the first bit line 101 is originally above the potential for the memory cell capacitor 104 corresponding to the storage of a logical zero in the memory cell 101, and a change in $V_{cc}$ causes the potential on the first bit line 101 to be lowered below the charge on the memory cell capacitor 104, the sense amplifier 110 will amplify a logical one state for the memory cell 101 causing the transmission of corrupted data therefrom.

Moreover, it will further be apparent to those of skill in the relevant art, that the performance of a refresh operation maintains the correct potential difference between the first bit line 101 and the memory cell capacitor 104. It therefore follows that the integrity of the data stored within memory cell 100 may be accurately maintained while supply voltage $V_{cc}$ is being varied, by performing the refresh operation with sufficient frequency so as to prevent the creation of an incorrect potential difference between the first bit line 101 and the memory cell capacitor 104. It is a principle of the present invention that maintenance of this correct potential difference may be achieved by creating an association between the rate of change of supply voltage provided to the DRAM and the rate at which refresh signals instructing the DRAM to perform the refresh operation are provided thereto.

Figure 2:
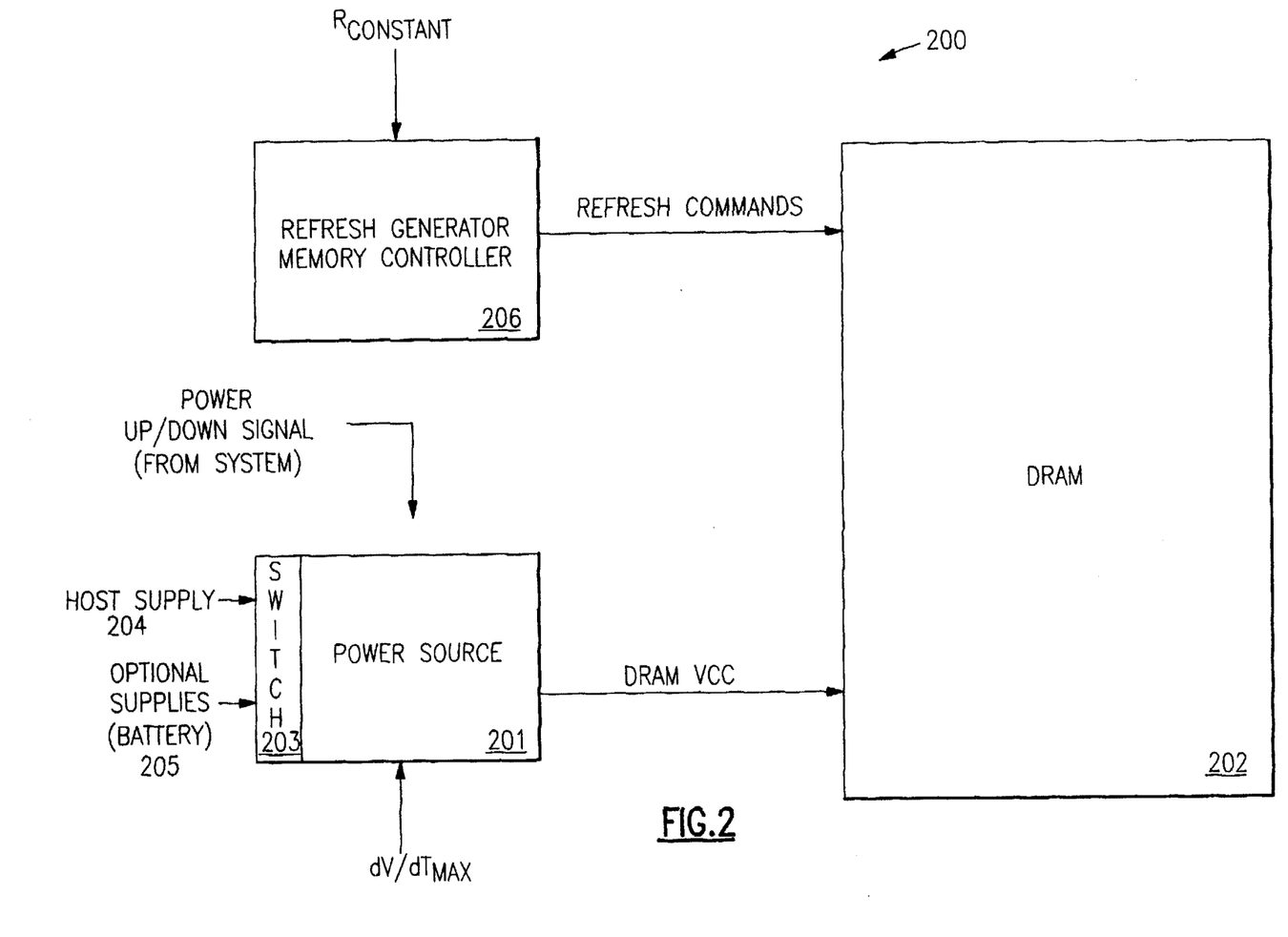
FIG. 2 depicts a block diagram of a memory system designed according to the principles of the present invention.

Turning now to our invention in greater detail, reference may be had to FIG. 2, wherein a block diagram of an exemplary memory system 200 generally designed in accordance with the principles of the invention is illustrated. The exemplary memory system 200 includes a power source element 201, which serves to couple a supply voltage to the DRAM 202. The power source may receive the supply voltage from any number of common power supply sources. Without loss of generality, FIG. 2 depicts the power source element 201 coupling, via a switching circuit 203, either a supply voltage from a host computer system 204 or a supply voltage from a battery 205 included in the memory subsystem to the DRAM 202. In the illustrated embodiment, the memory subsystem 200 may be included on a card such as a PCMCIA card which is intended for removable insertion into a host computer system. Such an application is discussed in U.S. patent application Ser. No. 521509 filed on Aug. 30, 1995 for Hadderman et al. (commonly owned by the present assignee). In such an embodiment, the power source 201 may, for example, switch the supply voltage for the DRAM 202 from the host computer supply voltage 204 to the battery-based supply voltage 205 when the memory subsystem 200 is removed from the host computer. However, for purposes of the present invention it is only necessary that the level of the supply voltage provided through the power source element 201 to the DRAM 202 is capable of variation by any means including without limitation voltage fluctuation from a single power supply as well as the removable attachment of the system to plural differently rated power supplies.

A DRAM controller including a refresh signal generator 206 is shown coupled to DRAM 202. The refresh signal generator provides a refresh signal to the DRAM 202 which causes the DRAM 202 to initiate a refresh cycle to maintain the voltage level stored in the memory cell capacitors and voltage reference cells within the DRAM 202. It is sufficient for purposes of the present invention merely to understand that a refresh operation must be performed periodically in order to maintain the data integrity of the data stored in the DRAM 202 and that a variation in the level of supply voltage provided by the power source 201 to the DRAM 202 may, if it exceeds a determinable level, and is not accompanied by a corresponding refresh signal, result in corruption of the data stored in the DRAM 202.

In order to ensure that data integrity is maintained within the exemplary memory system 200, the present invention comprises an inventive apparatus and associated techniques for establishing a relationship between the DRAM refresh rate and the supply voltage variation rate which will allow the DRAM to maintain data integrity during variation in either supply voltage or refresh signal rate. In a first embodiment, the invention entails the operation of the memory system 200 at either a constant refresh rate or a constant supply voltage change rate or the determination of a minimum refresh rate or a maximum supply voltage change rate which is then treated as a constant rate, such that the corresponding supply voltage change rate or refresh signal variation rate may be fixed to ensure that the DRAM data is not affected. In this first embodiment it is to be understood that the invention entails determining a first threshold rate, which may be either the constant or maximum voltage supply rate of the power supply or the constant or minimum rate of refresh signal generation, and thereafter establishing a second threshold rate In accordance with the determined first threshold rate. The second threshold rate will be the minimum established rate of refresh signal generation where the first threshold rate is the constant or maximum supply rate and the second threshold rate will be the maximum established rate of supply voltage change from the power source where the first threshold rate is the constant or minimum rate of refresh signal generation. In a second embodiment, the invention contemplates variable rates of both refresh and voltage variation with the refresh rate dependent on voltage variation rate. A third embodiment includes variable rates of both refresh and voltage variation with the voltage variation rate dependent on refresh rate. Each of these three preferred embodiments will be considered in turn.

The first embodiment, in which either the refresh rate or the rate of voltage variation may be held constant or the determined maximum rate of voltage variation or minimum refresh rate may be treated as being constant can be further partitioned into two counterpart embodiments: operation of the memory system 200 at a constant refresh rate or at a minimum refresh rate which in turn dictates the design of a power source 201 which operates at or below a maximum voltage variation rate; and operation of the memory system 200 at a fixed voltage variation rate or maximum voltage variation rate which dictates the design of a refresh signal generator (typically included in a DRAM controller) 206 which operates at or above a minimum refresh rate.

For illustrative purposes, consider the embodiment in which the memory system 200 includes a DRAM controller 206 which is to be operated at a constant refresh rate $R_{constant}$. From the foregoing general description, it is to be understood herein that the constant refresh rate may, in actuality, either be the fixed rate $R_{constant}$ at which refresh signals are provided by the DRAM controller 206 or, in an embodiment in which the refresh rate is not fixed, the value $R_{constant}$ may be assigned to the minimum determined refresh rate for the DRAM controller 206 $R_{min}$ which, for purposes of the memory system 200 design is treated as a constant refresh rate $R_{constant}$. The constant refresh rate $R_{constant}$ set by the controller in combination with the DRAM 202 timing properties for retaining data stored therein, necessarily limit the maximum rate at which the DRAM's supply voltage may change ($dV/dt_{max}$) through the power source 201. Once cognizant of this maximum limit, the designer must design a variable power source system 201 which will prevent the DRAM supply voltage variation rate from exceeding the maximum limit ($dV/dt_{max}$) set by the constant refresh rate $R_{constant}$ of the DRAM controller 206.

The above-described illustrative design may prove useful in memory systems 200 that have already been designed around specific DRAM controllers 206 and specific chip sets. A power up—power down feature may be implemented for such a memory system 200 by first determining the maximum voltage variation rate $dV/dt_{max}$ based on the constant refresh rate $R_{constant}$ of the memory system 200 and then designing a variable power source unit 201 which cannot exceed the maximum rate of voltage variation $dV/dt_{max}$ thereby permitting the DRAM 202 to be powered up or powered down at a rate which never exceeds $dV/dt_{max}$, which in turn ensures the integrity of data stored in the DRAM 202 during such a power up or power down operation.

As an example of a memory system 200 designed in accordance with the above-described parameters, consider a system containing a DRAM 202 which utilizes a 12/8 addressing scheme. The 12/8 addressing scheme is a common addressing scheme for DRAMs wherein the number 12 designates 12 row address bits and the number 8 designates 8 column address bits. The DRAM 202, therefore, contains $2^{12}$ or 4096 row addresses and a total of $2^{(12+8)}$ or 1M (1,048,576) address locations. Furthermore, assume for example, that the entire row address range including all of the 4096 row addresses is refreshed in sequential order at a constant rate (or alternatively at a minimum rate) ($R_{constant}$) of 15.6 us/cell. Finally, assume for purposes of this example, that the cell voltage variation tolerance for the DRAM 202 is 300 mv. From this exemplary information, it is possible to calculate the maximum rate of voltage change $dV/dt_{max}$ which will not adversely affect the integrity of data stored within the cells of the DRAM 202.

In order to calculate $dV/dt_{max}$ for the exemplary power source 201 which provides the supply voltage to the DRAM 202, it is first necessary to calculate the total time between refresh strobes for a given row address in the DRAM 202. Since the refresh rate $R_{constant}$ has been established as 15.6 us/row and since there are 4096 rows of cells in the DRAM 202 it follows that: 15.6 us/row * 4096 rows=63.8 ms. Thus, the elapsed time between sequential refresh strobes for any given row address for the DRAM 202 is approximately 64 ms. Using the determined duration between refresh cycles, the maximum allowable voltage variation $dV/dt_{max}$ for the power source 201 which provides supply voltage to the DRAM 202 may be determined. Since the maximum cell voltage variation tolerance for the DRAM 202 is 300 mv, it follows that: 300 mV/64 ms=4.68V/s (maximum). Thus, the maximum rate at which the supply voltage may be allowed to vary through the power source 201 in order to ensure the integrity of the data stored in the cells of DRAM 202 is 4.68V/s. Accordingly, the power source 201 must be designed in such a manner that it provides voltage to the DRAM 202 wherein the maximum rate of voltage variation supplied to the DRAM 202 never exceeds 4.68 V/s. Such a power source would typically comprise circuitry for monitoring an input reference voltage $V_{ref}$. The monitored input reference voltage may be utilized by the power source to set the level of the supply voltage supplied to the DRAM 202. Thus, the rate of the variation of $V_{ref}$ controls the supply voltage variation rate dV/dt. Having previously determined $dV/dt_{max}$ for the memory system 200, it is possible, via various techniques well known to those skilled in the art, including without limitation the implementation of a resistor capacitor network coupled to a reference voltage generator, to limit the variation rate of the reference voltage $V_{ref}$ to be within the slew rate defined by $dV/dt_{max}$.

A DRAM 202 which includes self-refresh circuitry, may also be used as described above. The self-refresh circuitry will have an associated refresh rate. This pre-set refresh rate will necessitate a maximum voltage variation rate for the power source 201 in a similar manner as was described above for $R_{constant}$ for the DRAM controller 206. A memory system 200 may further be designed so as to permit a DRAM 202 to enter a self-refresh mode after which the supply voltage provided thereto is reduced, this implementation would further reduce the power consumption of the memory system 200. In such a memory system the power source circuit 201 would be designed so that the maximum rate of voltage variation will allow for data retention in accordance with the self-refresh rate of the DRAM 201. Such a memory system design may entail the inclusion of refresh signal inhibit logic within the DRAM controller 206 actuated by a signal from the host indicating that the DRAM 202 is to be placed in self-refresh mode, which in turn causes the DRAM controller 206 to place the DRAM 202 into its self-refresh mode and, via the refresh signal inhibit logic, to inhibit the generation of refresh signals therefrom when the DRAM 202 has entered its self refresh mode. Memory system designs incorporating such a feature are well known to those skilled in the pertinent art, and as such, a detailed explanation of an exemplary design is not required for an understanding of the present invention. In such a system, it would also be necessary to consider the refresh rate of the DRAM 202 in its self-refresh mode when determining the minimum refresh rate which establishes $dV/dt_{max}$. In an alternative design, the power source 201 may include means for switching between two different maximum voltage slew thresholds ($dV/dt_{max}$) depending upon whether the refresh signals are being provided from the DRAM controller 206 or from the DRAM 202 in self-refresh mode.

The counterpart embodiment of the first example is a memory system 200 in which the power source 201 provides a supply voltage at a constant voltage variation rate, or at a maximum voltage variation rate which is to be treated as a constant ($dV/dt_{constant}$). In this example, the proper refresh rate $R_{min}$ to compensate for this determined voltage variation rate must be calculated. The DRAM controller 206 which provides the refresh signal to the DRAM 202 may be designed such that it always maintains a rate of provision of the refresh signals at or above the refresh rate $R_{min}$ dictated by the constant voltage variation rate $dV/dt_{constant}$. This embodiment would prove useful for applications in which the memory system 200 experiences large variations in supply voltage. The use of a DRAM 202 in such applications has typically been avoided as a consequence of the foregoing DRAM data integrity problems associated with voltage variation. Using the determined maximum rate of supply voltage variation $dV/dt_{max}$ which is treated as a constant $dV/dt_{constant}$, a minimum refresh rate $R_{min}$ may be calculated for the refresh signal from the DRAM controller 206 which will permit the DRAM 202 to maintain data integrity even when the voltage variation rate is at its maximum, thus allowing such a DRAM 202 to be used in systems with large variations in supply voltage.

As an example, consider the DRAM parameters described in the previous example, which comprised a DRAM 202 having a $^{12}\!/_{8}$ addressing scheme with 4096 row addresses which are sequentially refreshed, and which have a cell voltage variation tolerance of 300 mV. In the present example there exists a determined maximum variation $dV/dt_{max}$ in the supply voltage provided via the power source 201 to the DRAM 202. For illustrative purposes, assume that this determined maximum supply voltage variation which is to be treated as being constant $dV/dt_{constant}$ is 3V/s.

From this determined maximum supply voltage variation rate it is possible to calculate the minimum required refresh rate $R_{min}$ at which the DRAM controller 206 must be configured in order to provide refresh signals so as to maintain the integrity of the data stored in the DRAM 202. Initially, it is possible to determine that it will take 100 ms for the voltage to vary to the voltage variation tolerance level 300 mV via the following calculation: 300 mV * 1/(3V/s) =100 ms. Using the determined 100 ms time period associated with the 300 mV voltage variation tolerance it is possible to ascertain the minimum refresh rate $R_{min}$ that is required to ensure that a given row of cells in the DRAM 202 is refreshed before the voltage supplied to that row has varied by more than 300 mv via the following calculation: 100 ms/4096 rows=24.4 us. Thus, in order to ensure data integrity in the illustrative memory system 200, the DRAM controller 206 must be configured to ensure that each row in the DRAM 202 will receive a refresh strobe at least every 24.4 us. A typical DRAM controller 206 for such a memory system 200 is implemented in a programmable logic device ("PLD") such as a gate array or an application specific integrated circuit ("ASIC"), and as such the configuration of the refresh rate to ensure compliance with $R_{min}$ may be achieved via the logic design of the PLD, however it is also possible, and specifically contemplated herein, that various other design techniques may be employed to so-configure the DRAM controller 206.

Figure 3:
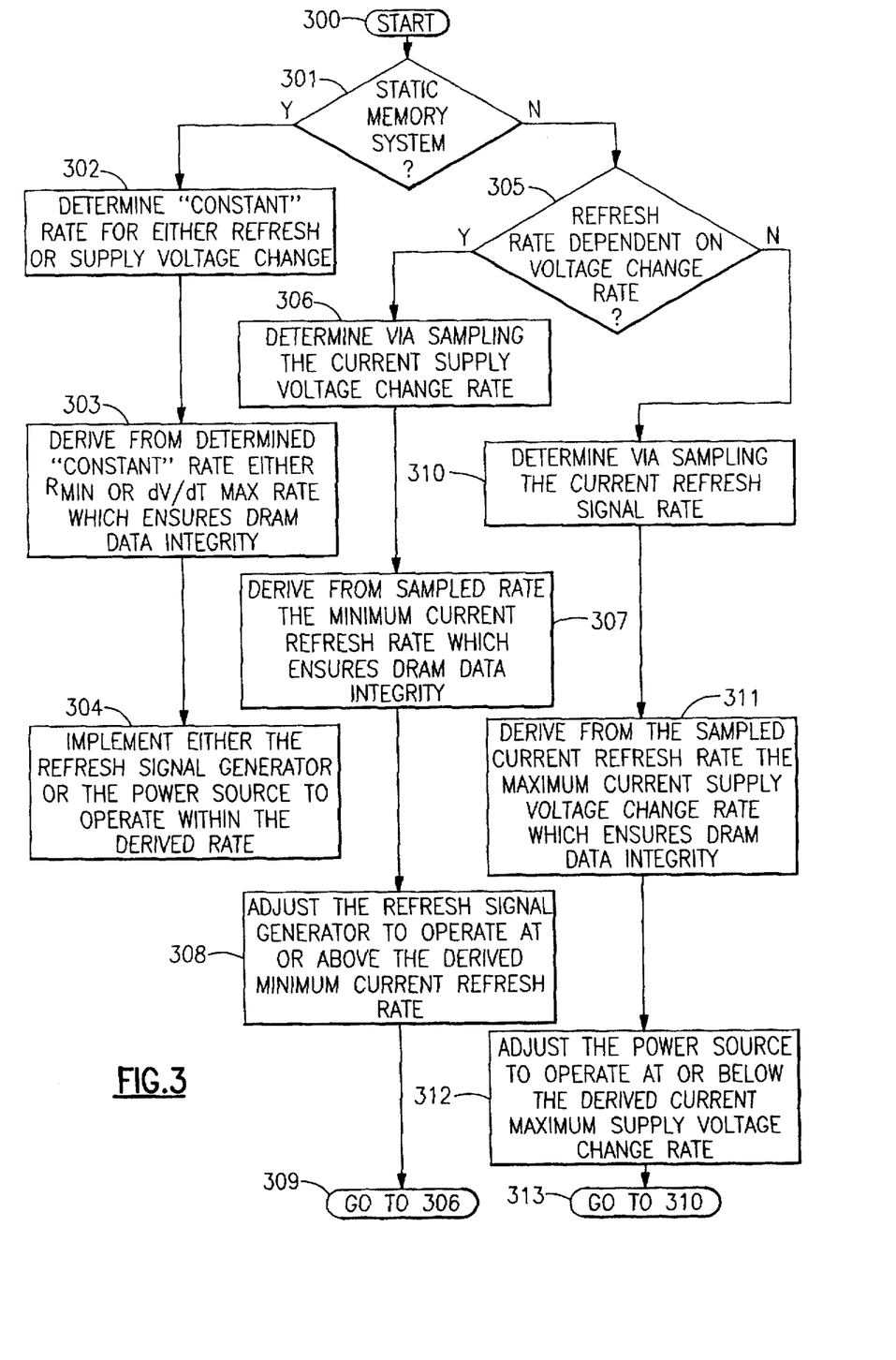
FIG. 3 depicts a flow diagram detailing the requisite steps for implementing a number of embodiments of the present inventive memory system.

Referring to FIG. 3, an illustrative flow diagram details, inter-alia, the design steps required for the above-described counterpart first embodiment memory systems. If it is desired to implement a static memory system 301 in which one of the refresh signal rate or the supply voltage change rate will be treated as being constant, the first step entails the determination of the constant rate 302. As previously described, the constant rate or so-called first threshhold rate may, in reality represent a determined maximum supply voltage change rate $dV/dt_{max}$ which is treated as a constant for purposes of the design, or likewise, it may entail the determination of a minimum refresh signal rate $R_{min}$ which will be treated as a constant for purposes of the design. In either case, the next step includes the derivation of a refresh signal or supply voltage change rate 303 corresponding to the previously determined 302 supply voltage change or refresh rate respectively, such that the DRAM will perform a refresh operation preserving the integrity of the data stored therein prior to experiencing a supply voltage change which might result in corrupted data. Finally, after the corresponding so-called second threshhold rate has been derived 303, the DRAM controller 206 or the power source 201 is implemented 304 such that it adheres to its previously derived rate.

Figure 4:
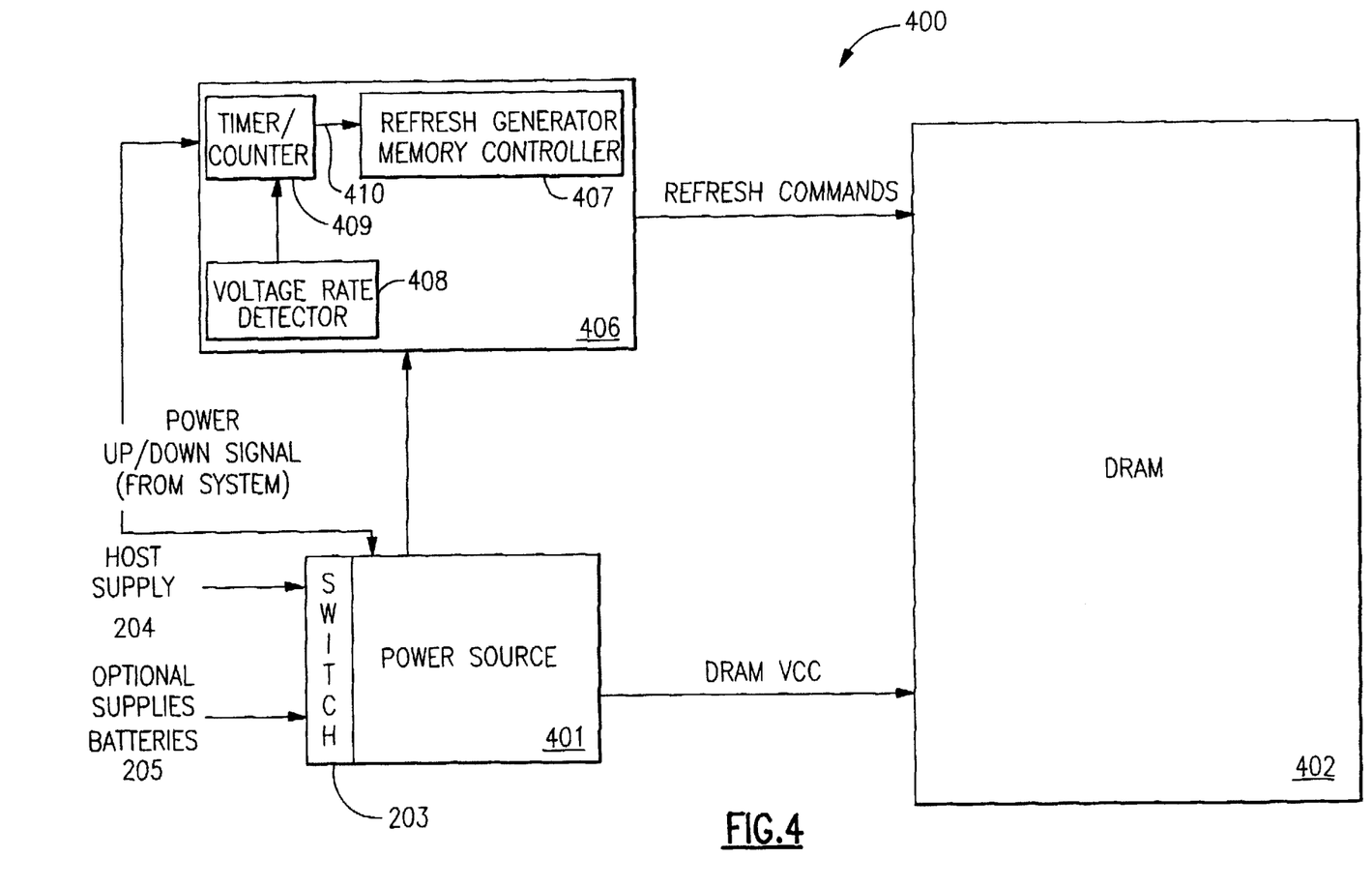
FIG. 4 depicts a block diagram of the memory system wherein the variable refresh rate is dependant upon the voltage variation rate.

Turning now to the second embodiment of the invention, a memory system 400, as illustrated in FIG. 4, may be implemented in which both the refresh rate and the voltage variation rate are variable, and in which the refresh rate is dependent on the voltage variation rate. In such a memory system 400, a voltage supply power source 401 supplies the variable rate supply voltage to the DRAM 402. The DRAM controller 406 typically includes a refresh unit 407, which can refresh the DRAM 402 at variable frequencies and which may be implemented such that the refresh signal rate is synchronous with the frequency of the input signal (hereinafter a sense signal) received thereby. This refresh unit 407 must be able to refresh the DRAM at rates which ensure the integrity of the data stored in the DRAM 402 even at times when the rate of supply voltage variation is maximized.

In order to establish this association between the variable refresh rate and the variable supply voltage rate, an interface voltage rate detector 408 between the DRAM refresh unit 407 and the DRAM voltage supply power source 401 is implemented so as to enable the refresh unit 407 to effectively monitor the rate of DRAM supply voltage change through the power source 401. The voltage rate detector 408 permits the definition of the correspondence between the refresh rate and the voltage variation rate such that, as the rate of supply voltage variation increases, the refresh rate will increase and as the rate of supply voltage variation decreases, the refresh rate will decrease.

The mechanism included in the voltage rate detector 408, for monitoring the voltage variation rate may be achieved via a variety of implementations. In an illustrative embodiment, and without loss of generality, the interface may comprise a voltage variation sense circuit 500 which couples the voltage supplied via the power source 401 to through a counter 409 to the refresh unit 407. The illustrative sense circuit 500, depicted in detail in FIG. 5, may, in an embodiment of the invention, be simply implemented via resistor 501 and capacitor 502 coupled in series, and in turn coupling the DRAM supply voltage signal from the power source 401 to the refresh unit 407. When there is no variation in the DRAM supply voltage which serves as input voltage 503 to the sense circuit 500, the output voltage 504 across the resistor 501 which is subsequently provided to the refresh unit 407 is 0v. As the input voltage 503 varies, the output voltage 504 subsequently provided to the refresh unit 407, will vary in proportion to the rate of the input voltage variation. This voltage variation, in turn, controls the rate for the refresh signal generated by the refresh unit 407.

Figure 5:
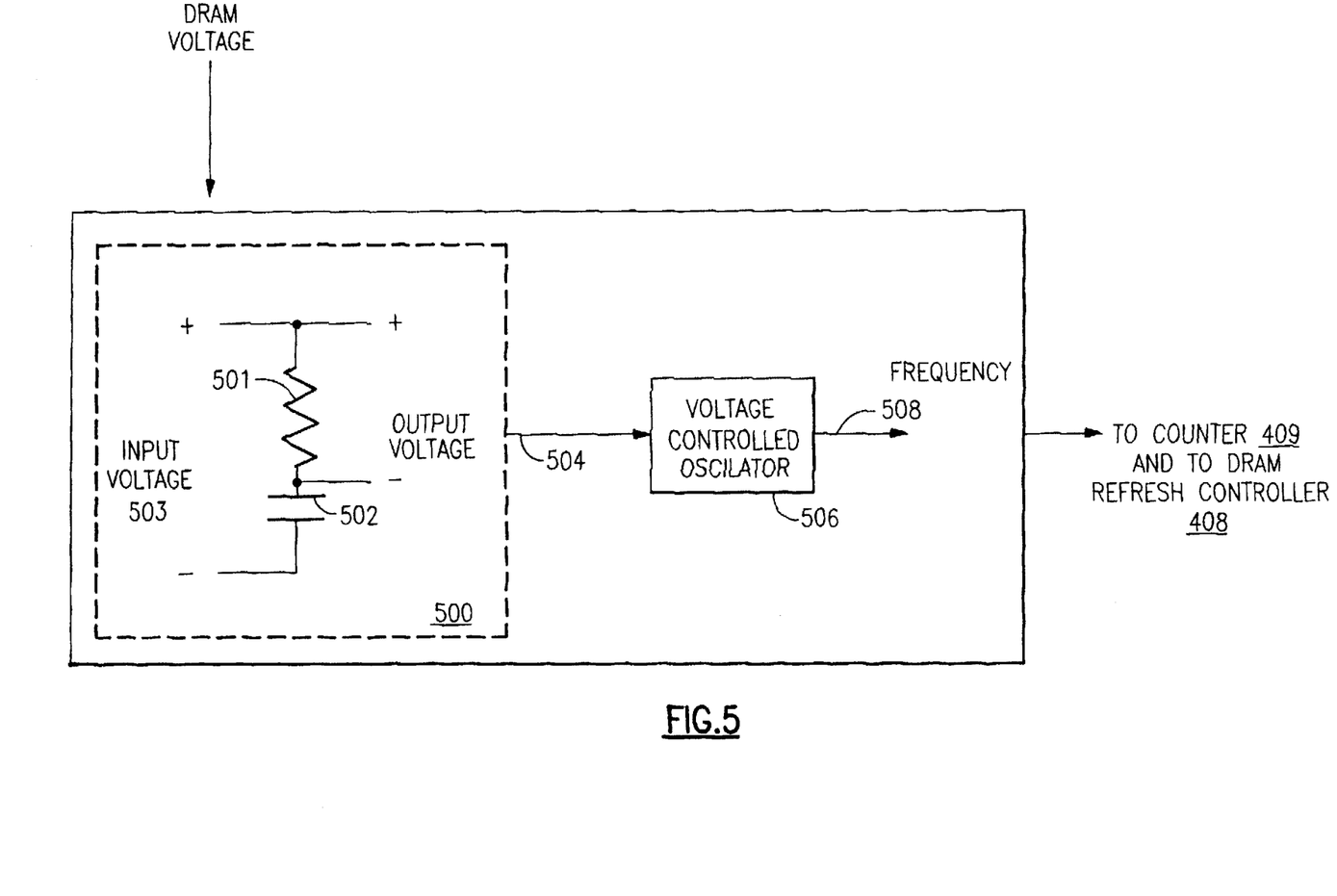
FIG. 5 depicts a detailed diagram of an exemplary sense circuit for use in memory system 400, for providing a voltage variation monitor interface between the power source and the refresh unit.

The sense circuit 500 and the refresh unit 407 may be coupled to one another in the illustrative embodiment via a voltage controlled oscillator (VCO) 506 and counter 409. The VCO 506 is designed such that its output signal (or sense signal) 508 frequency which is an input for counter 409, is proportional to the absolute value of the input voltage 503. As the magnitude of the output voltage 504 increases, implying an increase in the rate of supply voltage variation to the DRAM 402, the VCO 506 produces an output signal (or sense signal) 508 with a correspondingly increased frequency, which will in turn cause the counter 409 to increment its count at an augmented rate. The counter 409 may be configured to count up to a predetermined value before emitting a refresh generate signal 410 to the refresh unit 407. It therefore follows, that as the supply voltage variation rate increases, the frequency of the refresh generate signal 410 and corresponding the refresh signal rate from the refresh unit 407 will increase. Furthermore, from the foregoing description it will be readily understood by those skilled in the relevant art that a decrease in the DRAM supply voltage variation rate will correspondingly diminish the magnitude of the sense signal 508, which will correspondingly result in a decrease in the rate at which the refresh signal is provided from the refresh unit 407 to the DRAM 402.

Advantageously, memory systems 400 in which the refresh rate may vary to accommodate supply voltage variation rates need not operate at a pre-determined maximum refresh rate as would memory systems 200 designed in accordance with the first embodiment of the invention. In the variable refresh rate memory system 400, the refresh rate can be slowed when the supply voltage variation rate slows which in turn increases the access availability of the DRAM 402, and accordingly reduces the power consumed as well as the heat produced by the DRAM 402.

Referring again to the flow diagram of FIG. 3 it can be seen that where a dynamic memory system 400 wherein the refresh rate is dependent upon the supply voltage change rate 305 is designed, the first step entails the determination of the current supply voltage change rate 306. Upon determining the current supply voltage change rate, the requisite minimum current refresh signal rate which will ensure that the DRAM 402 is refreshed prior to a change in the DRAM supply voltage which could corrupt the DRAM data occurs, is derived 307. Once this minimum current refresh rate is derived 307, the refresh signal generator portion of the DRAM controller 406 is adjusted to provide refresh signals to the DRAM 402 at or above the derived minimum refresh rate 308. The above described steps 306–308 are constantly repeated 309 so as to sample the new current supply voltage change rate.

Figure 6:
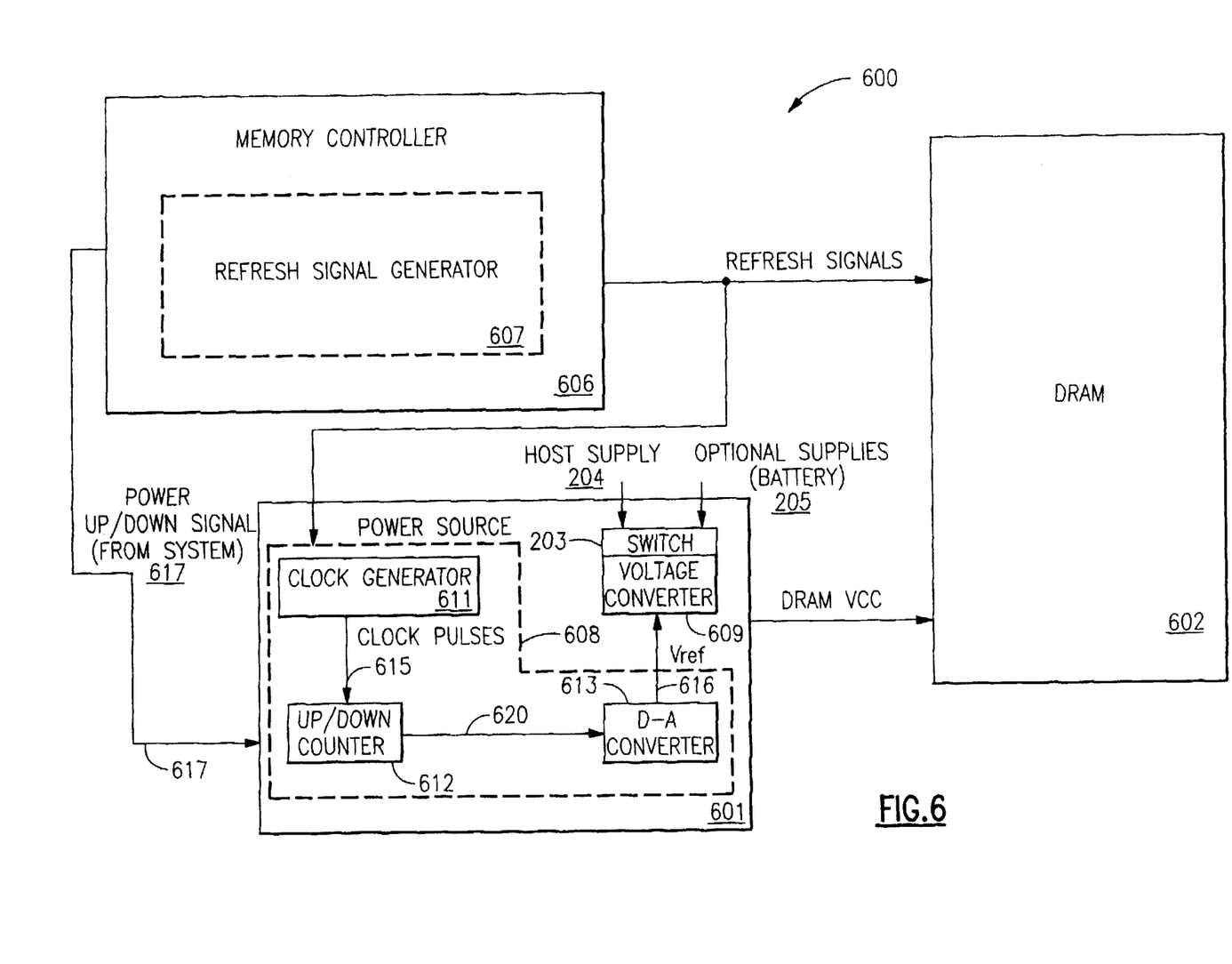
FIG. 6 depicts a block diagram of the memory system wherein the voltage variation rate is dependant upon the variable refresh rate.

Turning now to a third embodiment of the invention, a memory system such as the memory system 600 depicted in FIG. 6 may be implemented in which both the refresh rate and the voltage variation rate are variable and in which the voltage variation rate is dependent upon the refresh rate. In such a memory system 600, a voltage supply power source 601 may be designed to provide the DRAM supply voltage to the DRAM 602 at different rates of voltage variation dV/dt. A refresh unit 607 also exists, usually as part of a DRAM controller 606, which provides refresh signals to the DRAM 602 for refreshing the data stored therein. The illustrative DRAM controller 606, through the refresh unit 607 may generate these refresh signals at variable frequencies thereby refreshing the DRAM 602 data at variable frequencies. In an illustrative embodiment of such a memory system 600, an interface or refresh rate detector 608 exists between the DRAM refresh unit 607 and the DRAM voltage supply power source voltage converter 609 which enables the voltage converter 609 to effectively monitor the rate at which the DRAM refresh signals are provided by the refresh unit 607.

An exemplary refresh rate detector 608, includes a clock generator 611, coupled to an up/down counter 612, which is in turn coupled to a digital to analog (D-A) converter 613 which is coupled to the voltage converter 609. The clock generator 611 receives, as an input signal, the refresh signals from the refresh unit 607, and generates an output clock pulse 615 for every refresh signal received. The voltage converter component 609 comprises circuitry for monitoring an input reference voltage $V_{ref}$ 616. This reference voltage $V_{ref}$ 616 is used by the voltage converter 609 to set the level of the supply voltage which is supplied to the DRAM 602. The voltage converter 609 receives a source voltage from an external source and monitors the reference voltage $V_{ref}$ 616 to maintain power to the DRAM 602 such that the supply voltage provided to the DRAM 602 is proportional to the input reference voltage $V_{ref}$ 616. The reference voltage $V_{ref}$ 616 that is used by the voltage converter 609 for provision of supply voltage to the DRAM 602 is in turn generated by the D to A converter 613. The up/down counter 612 is capable of counting up to a predetermined maximum count level and of counting down to a predetermined minimum count level. The determination of whether the counter 612 is to count up or count down is dependant upon the then existing state of the memory system 600. In the illustrative example of such a memory system 600, the up/down counter 612 receives a power up/down signal 617 from the host system, indicative of whether the memory system 600 is currently being powered up or down. The up/down counter 612 will count up in response to power up request signals 617 and correspondingly the up/down counter 612 will count down in response to power down request signals 617. The up/down counter 612 utilizes the clock signal 615 received from the clock generator 611 to trigger each incremented or decremented count.

During steady state operation, while the memory system 600 is neither powering up or powering down, the up/down counter 612 is maintained at its predetermined minimum or maximum count level. This predetermined minimum or maximum count level is in turn provided as a digital input signal 620 to the D to A converter 613 where it is converted to reference voltage $V_{ref}$ 616 which is proportional to a steady state (i.e. a power up or power down) supply voltage for the DRAM 602. This reference voltage $V_{ref}$ 616 is monitored as previously described by the voltage converter 609 which in turn provides the normal operating supply voltage to the DRAM 602.

Upon sensing a power up/down request signal 617 from the host system, the up/down counter 612 begins to count up or down toward its predetermined maximum or minimum count level. The up/down counter 612 will only increment or decrement, however, upon receipt of a clock pulse 615 from clock generator 611. Thus, the frequency of the clock pulse 615, will determine the rate at which the up/down counter 612 will count and correspondingly, the rate at which the D to A converter receives a digital signal and ultimately, the rate at which the DRAM voltage will rise to the power up level or drop to the power down level. It has previously been established that the frequency of the clock pulse 615 is directly proportional to the refresh signal frequency from the refresh unit 607. Accordingly, it will be apparent from the foregoing description that the refresh signal frequency will limit the slew rate of the DRAM's supply voltage.

A memory system 600 designed generally in accordance with the principles of the illustratively depicted third embodiment of the present invention would prove useful in a processing system designed with a low power mode of operation. When such a processing system initiates a power down mode, for example, a signal is sent to the power source 601. Upon sensing this signal, the power source 601 begins reducing the supply voltage provided to the DRAM 602 at a rate corresponding to the refresh rate sensed by the refresh rate detector 608. As the supply voltage provided to the DRAM 602 decreases, the power source 601 via the refresh rate detector 608, will continually monitor the refresh rate and adjust the supply voltage variation rate accordingly. This voltage slew continues until the DRAM supply voltage has reached the power down voltage level. When the memory system 600 subsequently resumes normal power mode, the power down signal is removed and the reverse operation occurs raising the DRAM voltage above the power down level.

Referring once again to the illustrative flow diagram of FIG. 3, a dynamic memory system 600 in which the current supply voltage rate is derived from the current refresh signal rate 305, is designed by first sampling the current refresh signal rate 309 from the refresh signal generator 607. The sampled current refresh signal rate is then used to derive 310 the maximum current supply voltage change rate for the power source 601 which will ensure that the DRAM 602 is refreshed prior to the occurrence of a change in the DRAM supply voltage which could corrupt the DRAM data. Once the maximum current supply voltage change rate for the power source 601 has been derived the final step entails adjusting the power source 601 to provide supply voltage to the DRAM 602 with a supply voltage change rate at or below the derived maximum current supply voltage change rate 311. The above described steps 310–312 are constantly repeated thereafter 313, so as to sample the new current refresh rate.

In memory systems which are designed in accordance with the principals of the second and third embodiments of the invention such as memory systems 400 and 600, it is possible to incorporate a DRAM which includes a self-refreshing operation, in a manner similar to that described for the exemplary embodiments characterized by memory system 200. For a memory system designed in accordance with memory system 400, the inclusion of such a feature would dictate the design of a power source 401 having a maximum voltage slew rate $dV/dt_{max}$ determined in accordance with the specified minimum self-refresh rate $R_{min}$ for the self-refreshing DRAM 402. Alternatively, memory system 400 may include means for ascertaining from a connected host system that the DRAM 402 has been placed in a self-refresh mode and for adhering to the specified minimum self-refresh rate $R_{min}$ for the self-refreshing DRAM 402 while the self-refresh operation mode persists. In memory systems typified by the memory system 600, the power source 601 includes the refresh rate detector 608 which, as previously described, samples the refresh rate from the DRAM controller 606. When the DRAM 602 in memory system 600 enters self-refresh mode, the provision of refresh signals from the DRAM controller 606 to the DRAM 602 are inhibited in a manner similar to that which has been previously described in connection with memory system 200. At this point the refresh rate detector 608 will determine that no refresh signals are being sent from the DRAM controller 606 to the DRAM 602 and accordingly that the DRAM has entered its self-refresh mode. In response to this determination, the power source 601 will operate by providing supply voltage to the DRAM 602 at a maximum voltage slew rate $dV/dt_{max}$ which is commensurate with the specified minimum self-refresh rate $R_{min}$ for the DRAM 602 to ensure that the integrity of the data stored therein in maintained.

Although preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention as defined in the following claims which should be construed to maintain the proper protection for the invention first disclosed.

Having described our invention, what we claim as new and desired to secure by Letters Patent is as follows:

1. In a memory system for supporting a memory, said memory capable of performing refresh operations to maintain a logical state for data stored therein, said memory system including a power source for providing supply voltage to the memory, and a refresh signal generator for providing a refresh signal to the memory for causing the memory to perform the refresh operation, and wherein a predetermined level of supply voltage variation may be experienced by the memory prior to the performance of said refresh operations for said data, without loss of the logical state associated with the data stored therein, a method for operating the memory system to permit the supply voltage to be varied beyond said predetermined level of supply voltage variation without loss of the logical state associated with the data, the method comprising the steps of:
   determining a first threshold rate for one of said power source and said refresh signal generator;
   establishing a second threshold rate for the other of said power source and said refresh signal generator, said established second threshold rate being derived from said determined first threshold rate to ensure that the data stored in said memory has been refreshed before the supply voltage provided to the memory varies beyond said predetermined level; and
   designing the other of said power source and said refresh signal generator to operate within said established second threshold rate.

2. A method according to claim 1 wherein the determined first threshold rate is a maximum rate of supply voltage change from the power source and the established second threshold rate is a minimum rate of refresh signal generation from the refresh signal generator.

3. A method according to claim 1 wherein the determined first threshold rate is a minimum rate of refresh signal generation from the refresh signal generator and the established second threshold rate is a maximum rate of supply voltage change from the power source.

4. A method according to claim 1 wherein the determined first threshold rate is a constant rate.

5. A method according to claim 4 wherein the determined first threshold rate is a constant rate of supply voltage change from the power source and the established second threshold rate is a minimum rate of refresh signal generation from the refresh signal generator.

6. A method according to claim 4 wherein the determined first threshold rate is a constant rate of refresh signal generation from the refresh signal generator and the established second threshold rate is a maximum rate of supply voltage change from the power source.

7. A method according to claim 1 wherein the power source includes means for connecting to a plurality of power supplies.

8. A method according to claim 1 wherein the operation of said memory system to permit the supply voltage to be varied beyond said predetermined level of supply voltage variation includes powering up the memory system from a powered down state.

9. A method according to claim 1 wherein the operation of said memory system to permit the supply voltage to be varied beyond said predetermined level of supply voltage variation includes powering down the memory system from a powered up state.

10. A method according to claim 1 wherein the memory is a DRAM.

11. A method according to claim 10 wherein the DRAM includes a self-refresh mode of operation.

12. A method according to claim 11 wherein the refresh signal generator includes means for inhibiting the provision of the refresh signal therefrom if the DRAM is operating in the self-refresh mode of operation.

13. A method according to claim 11 further comprising the steps of:
   determining the refresh rate of the DRAM if the DRAM is operating in the self-refresh mode of operation;
   establishing a supply voltage variation rate for said power source in accordance with said determined refresh rate of the DRAM to ensure that the DRAM refreshes the data stored therein before the supply voltage provided to the DRAM has varied beyond the predetermined level; and
   adjusting the power source to operate at said established supply voltage variation rate.

14. An apparatus for supporting a memory, said memory being capable of performing refresh operations to maintain a logical state for data stored therein, said memory is further being capable of experiencing a predetermined level of supply voltage change prior to the performance of said refresh operations without loss of the logical state of the data stored therein, wherein said apparatus permits the supply voltage to be varied beyond said predetermined level without the loss of the logical state of the data stored in the memory, the apparatus comprising:
   a power source having means for coupling to said memory for providing a supply voltage to the memory; and
   a refresh signal generator having means for coupling to said memory for providing a refresh signal to said memory to cause said memory to perform said refresh operations; and wherein a first one of said power source and said refresh signal generator operates at a first threshold rate and the other of said power source and said refresh generator is implemented to operate within a second threshold rate so as to ensure that the data stored in the memory has been refreshed before the supply voltage has varied beyond said predetermined level.

15. An apparatus according to claim 14 wherein said first threshold rate is a maximum rate of supply voltage change from the power source and the second threshold rate is a minimum rate of refresh signal generation from the refresh signal generator.

16. An apparatus according to claim 14 wherein said first threshold rate is a minimum rate of refresh signal generation from the refresh signal generator and the second threshold rate is a maximum rate of supply voltage change from the power source.

17. An apparatus according to claim 14 wherein the first threshold rate is a constant rate.

18. An apparatus according to claim 17 wherein the first threshold rate is a constant rate of supply voltage change from the power source and the second threshold rate is a minimum rate of refresh signal generation from the refresh signal generator.

19. A method according to claim 17 wherein the first threshold rate is a constant rate of refresh signal generation from the refresh signal generator and the second threshold rate is a maximum rate of supply voltage change from the power source.

20. An apparatus according to claim 14 wherein the power source further includes means for connecting to a plurality of power supplies.

21. An apparatus according to claim 14 wherein the operation of said memory system to permit the supply voltage to be varied beyond said predetermined level of supply voltage variation includes powering up the memory system from a powered down state.

22. An apparatus according to claim 14 wherein the operation of said memory system to permit the supply voltage to be varied beyond said predetermined level of supply voltage variation includes powering down the memory system from a powered up state.

23. An apparatus according to claim 14 wherein the memory is a DRAM.

24. An apparatus according to claim 23 wherein the DRAM includes a self-refresh mode of operation.

25. An apparatus according to claim 24 wherein the refresh signal generator further includes means for inhibiting the provision of the refresh signal therefrom if the DRAM is operating in the self-refresh mode of operation.

26. An apparatus according to claim 24 further comprising means for determining the refresh rate of the DRAM if the DRAM is operating in the self-refresh mode of operation;

means for establishing a supply voltage variation rate for said power source in accordance with said determined refresh rate of the DRAM to ensure that the DRAM refreshes the data stored therein before the supply voltage provided to the DRAM has varied beyond the predetermined level; and means for adjusting the power source to operate at said established supply voltage variation rate.

* * * * *